US005486900A

United States Patent [19]

Wada et al.

[11] Patent Number: 5,486,900

[45] Date of Patent: Jan. 23, 1996

[54] MEASURING DEVICE FOR AMOUNT OF CHARGE OF TONER AND IMAGE FORMING APPARATUS HAVING THE MEASURING DEVICE

[75] Inventors: Takasumi Wada, Nara; Keiji Taniguchi, Fukui; Yoichi Yamamoto, Nara, all of Japan

[73] Assignee: Sharp Kabushiki Kaisha, Osaka, Japan

[21] Appl. No.: 349,663

[22] Filed: Dec. 5, 1994

[30] Foreign Application Priority Data

Dec. 6, 1993 [JP] Japan .................................... 5-305577

[51] Int. Cl.[6] .......................... G01R 29/24; G03G 15/08

[52] U.S. Cl. .............................................. 355/203; 324/452

[58] Field of Search .................................... 355/203, 245, 355/246; 430/31; 324/452; 356/335, 336; 382/100

[56] References Cited

U.S. PATENT DOCUMENTS

| | | | |
|---|---|---|---|
| 4,375,673 | 3/1983 | Lewis et al. | 364/555 |
| 4,633,714 | 1/1987 | Mazumder et al. | 356/336 X |
| 5,266,900 | 11/1993 | Epping | 324/452 |

FOREIGN PATENT DOCUMENTS

| | | |
|---|---|---|
| 61-277071 | 12/1986 | Japan . |
| 62-287169 | 12/1987 | Japan . |
| 1-025154 | 1/1989 | Japan . |
| 4-025772 | 1/1992 | Japan . |

OTHER PUBLICATIONS

Patent Abstracts of Japan, vol. 12, No. 175 (P–707), May '88, abstracting JP 62–287 169 of Dec. '87.

Patent Abstracts of Japan, vol. 13, No. 209 (P–871) [3557], May '89, abstracting JP 1–025 154 of Jan. '89.

Y. Takahashi et al., "Triboelectric Charge Polarity and its Distribution on Toner Particles", in *Proceedings—The Fifth International Congress on Advances in Non–Impact Printing Technologies,* San Diego, Calif., Nov. '89, pp. 206–212.

Patent Abstracts of Japan, vol. 16, No. 189 (P–1348), May '92 abstracting JP 4–025 772 of Jan. '92.

*Primary Examiner*—Joan H. Pendegrass
*Attorney, Agent, or Firm*—David G. Conlin; Milton Oliver

[57] ABSTRACT

A measuring device for an amount of charge of toner including countered first and second electrodes for forming an electric field which accelerates toner particles, a voltage generator for applying a voltage across the first and second electrodes, a magnifying optical system for magnifying the image of toner particles which move between the first and the second electrodes, a light source for illuminating a vicinity of a focus of the magnifying optical system, a CCD sensor for receiving an optical image of the toner particles magnified by the magnifying optical system so as to convert the optical image into an image signal and a CPU for controlling a voltage from the voltage generator based upon the image signal so that the toner particles pass a prescribed position in the vicinity of the focus of the magnifying optical system and for obtaining an amount of charge of toner particles from a value of the voltage, and an image forming apparatus in which the measuring device is installed. The measuring device for an amount of charge of toner becomes compact, so it can be installed in an image forming apparatus.

16 Claims, 4 Drawing Sheets

MEASURING DEVICE FOR AMOUNT OF CHARGE OF TONER AND IMAGE FORMING APPARATUS HAVING THE MEASURING DEVICE

FIELD OF THE INVENTION

The present invention relates to a measuring device for an amount of charge of toner and an image forming apparatus such as a copying machine having the measuring device.

BACKGROUND OF THE INVENTION

As a measuring method for an amount of charge of toner, a blow-off method is known.

In the blow-off method, a binary developer composed of toner particles and carrier particles is placed on a retaining member having meshes which are bigger than a diameter of a toner particle and are smaller than a diameter of a carrier particle, and only the toner particles are blown off by dry air blow (for example, nitrogen). Then, an amount of charge of carrier remained on the retaining member is measured so that an amount of charge of toner is obtained by the weight.

However, with the blow-off method, since a measured value changes with flow of dry air blow and a time required for measurement, it is difficult to measure an accurate amount of charge of toner. Moreover, distribution of the amount of charge cannot be obtained. Further, since an unary developer does not include carriers, an amount of charge of toner cannot be theoretically measured by using the unary developer.

The Japanese Unexamined Patent Publication No. 79958/1982 (Tokukaisho 57-79958) discloses the following method. Toner particles are introduced into a chamber where air blow has been sent at an uniform speed and an uniform electric field has been formed, the toner particles which have passed through the electric field are accumulated on a sheet and distribution of the toner particle on the sheet is measured so that distribution of a relative amount of charge of toner is obtained.

However, in the above method, since it is necessary to take out sheets where the toner particles are accumulated for every measurement, there exists a problem that successive measurement cannot be made. Moreover, there exists a problem that an amount of charge of each toner particle cannot be measured.

The Japanese Unexamined Patent Publication No. 277071/1986 (Tokukaisho 61-277071) discloses the following method. Toner particles are allowed to freely fall to a vertical passage where an electric field has been formed, a laser beam is irradiated to toner which passes a measurement position and a speed of the toner particles is measured from Doppler frequency of a scattered light so that an amount of charge and distribution of the amount of charge are obtained.

However, in this method, since momentum of the toner particles is small, the toner particles adhere to a wall surface of the passage. Therefore, there exists a problem that the toner particles is difficult to pass the measurement position. Furthermore, since toner is usually black, if a strong laser beam is not irradiated, a scattered light having strength necessary for measurement cannot be obtained. For this reason, since a large-size laser such as a He—Ne laser, or an Ar laser is required, there exists a problem that a measuring device becomes larger.

In addition, Japanese Unexamined Patent Publication No. 25772/1992 (Tokukaihei 4-25772) discloses the following method. Toner particles which fly at uniform flow velocity in an electric field are observed by using a magnifying optical system, and a diameter and displacement of the toner particles are obtained by image-processing observed data so that an amount of charge of toner is obtained.

However, in this method, since an observation range is narrow, it is necessary to scan an observation region in order to observe all the toner particles. For this reason, there exists the same problem as in the above-mentioned methods that a measuring device becomes larger.

As mentioned above, since a measuring device is large even if any of the above methods is used, there exists a problem that the measuring device is difficult to be installed in an image forming apparatus, such as a copying machine. Moreover, since toner particles are extracted as sample so that an amount of charge of the sample is measured, there exists a problem that an amount of charge of toner at the time of image formation cannot be obtained.

SUMMARY OF THE INVENTION

It is an object of the present invention to provide a small-sized measuring device for an amount of charge of toner which is capable of being installed in an image forming apparatus, such as a copying machine, and to provide an image forming apparatus, such as a copying machine, which is capable of obtaining an amount of charge of toner at the time of image formation by installing the measuring device.

In order to achieve the above object, the measuring device for an amount of charge of toner according to the present invention includes:

countered first and second electrodes for forming an electric field which accelerates toner particles;

a voltage generator for applying a voltage across the first and second electrodes;

a magnifying optical system for magnifying the toner particles which move between the first and second electrodes;

a light source for illuminating a vicinity of a focus of the magnifying optical system;

a CCD sensor for receiving an image of the toner particles magnified by the magnifying optical system so as to convert the image into an image signal; and control means for controlling a voltage from the voltage generator based upon the image signal so that the toner particles pass a prescribed position in the vicinity of the focus of the magnifying optical system and for obtaining an amount of charge of toner particles from a value of the voltage.

The above arrangement makes it possible to obtain the amount of charge of toner particles by illuminating only the vicinity of the focus of the magnifying optical system. For this reason, a small-sized light source is sufficient. Moreover, a scan system for observing a wide region is not required. As a result, the measuring device for an amount of charge of toner becomes compact, thereby making it possible to install it in an image forming apparatus.

In addition, the image forming apparatus of the present invention includes:

a photosensitive drum;

a developing unit for allowing charged toner to adhere to the photosensitive drum according to image information; and the measuring device in order to measure the amount of charge of toner charged in the developing unit.

As a result, since the amount of charge of toner at the time of image formation can be obtained, the amount of charge of toner can be set to an optimum value. This makes it possible to obtain an image of high quality.

For a fuller understanding of the nature and advantages of the invention, reference should be made to the ensuing detailed description taken in conjunction with the accompanying drawings.

DESCRIPTION OF THE EMBODIMENT

Figure 1:
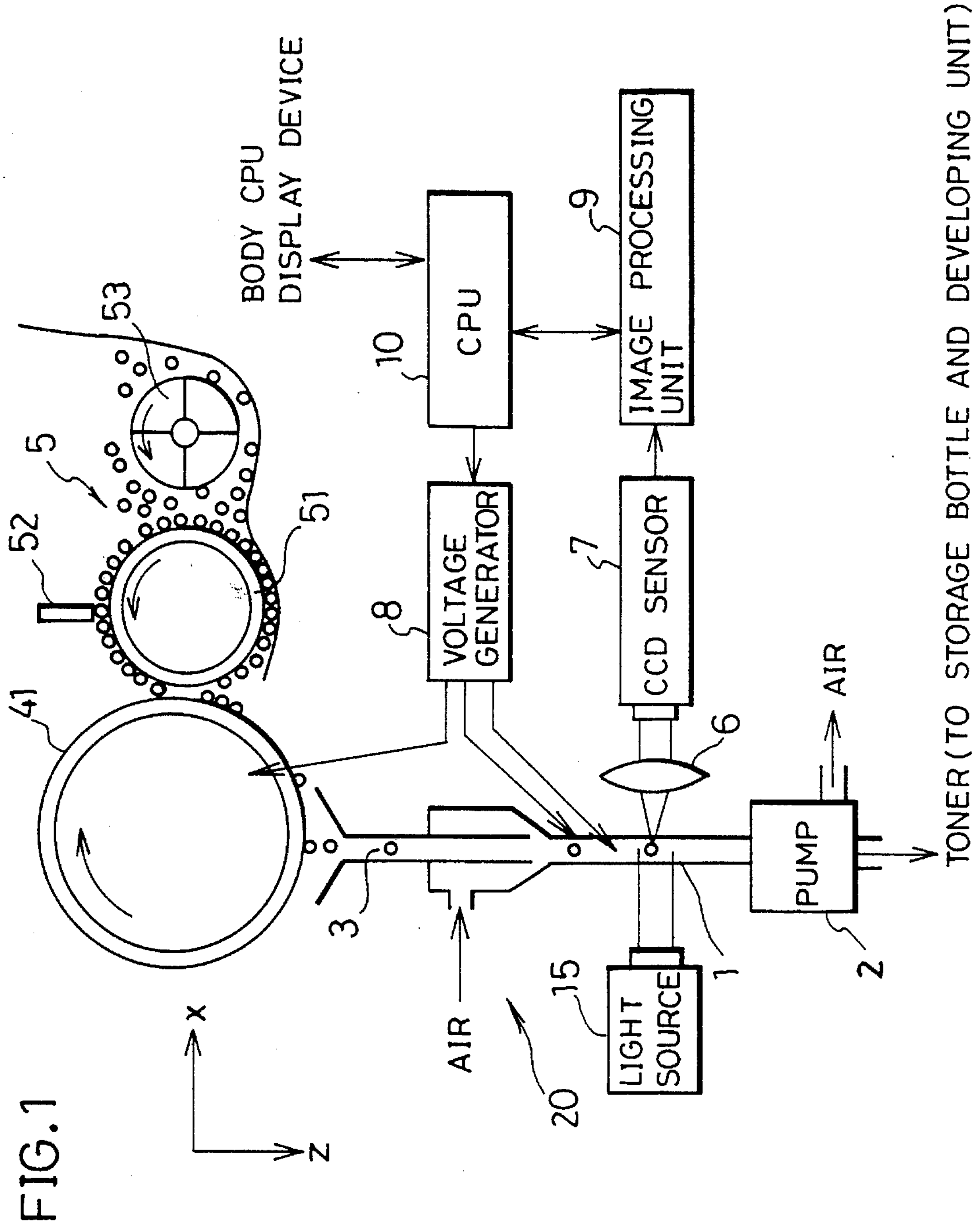
FIG. 1 is a constitutional drawing of a copying machine which schematically shows a first embodiment of the present invention.
Figure 2:
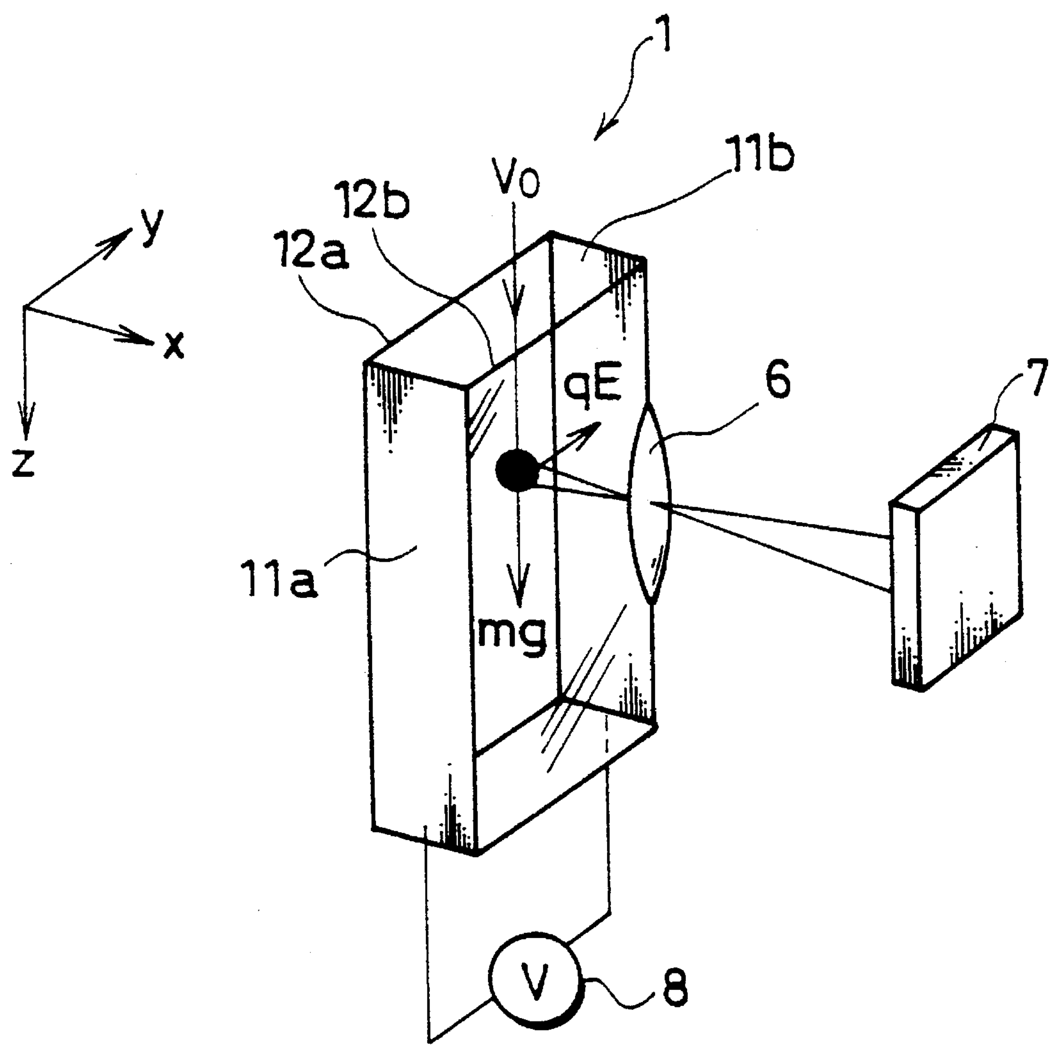
FIG. 2 is an explanatory drawing which shows a constitution of a chamber in the copying machine shown in FIG. 1.

Referring to FIGS. 1 and 2, the following description will discuss a first embodiment of the present invention.

As shown in FIG. 1, a copying machine (image forming apparatus) of the present invention includes a drum-like electrode 41, a developing unit 5 and a measuring section for an amount of charge of toner 20.

The developing unit 5 is arranged so as to have an agitating roller 53 for agitating a binary developer composed of non-magnetic toner particles and magnetic carrier particles, a magnet roller 51 for carrying the agitated developer to the electrode 41 and a blade 52 for keeping a layer thickness of the developer on the magnet roller 51 constant.

The drum-like electrode 41 is arranged so as to approach or contact with the developer on the magnet roller 51.

The agitating roller 53, the magnet roller 51 and the electrode 41 are respectively rotated by driving means such as a motor (not shown).

The measuring section for an amount of charge of toner 20 includes an extraction opening 3 for extraction of toner particles placed adjacent to the electrode 41, a chamber 1 for measurement of an amount of charge of toner and a pump 2 for generating air flow in the z-axis direction in order to lead the extracted toner particles to the chamber 1. Here, the z-axis is an axis which is in a vertical direction.

As shown in FIG. 2, the chamber 1 is placed so that its length is parallel to the z-axis direction. The chamber 1 includes windows 12*a* and 12*b* (first and second windows), which are vertical to the x-axis and arranged opposite to each other, and electrodes 11*a* and 11*b* (first and second electrodes), which are vertical to y-axis and are opposite to each other. The windows 12*a* and 12*b* are composed of a light transmitting material such as glass, and on their inner surfaces, a conductive coating with high resistance, which has the light transmitting property and shows an uniform resistance value, is formed.

At both ends of the electrodes 11*a* and 11*b* on the conductive coating having high resistance in the windows 12*a* and 12*b*, electrode sections are provided along sides of the windows 12*a* and 12*b*. The electrode section on the electrode 11*a* side of the conductive coating having high resistance in the window 12*a* is electrically connected with the electrode 11*a*, and the electrode section on the electrode 11*b* side of the conductive coating having high resistance in the window 12*b* is electrically connected with the electrode 11*b*. Moreover, the electrode section on the electrode 11*b* side of the conductive coating having high resistance in the window 12*a* can be electrically connected with and also insulated from the electrode 11*b* by a switch (not shown), and the electrode section on the electrode 11*a* side of the conductive coating having high resistance in the window 12*b* can be electrically connected with and also insulating from the electrode 11*a* by a switch (not shown).

The measuring section 20 for an amount charge of toner further includes a light source 15, a magnifying optical system 6, a CCD (charge coupled device) sensor 7, an image processing unit 9, a voltage generator 8 and a CPU (central processing unit) 10 (control means). The light source 15 irradiates a light through the window 12*a* to toner particles which pass through the chamber 1, the magnifying optical system 6 is used for observing toner particles through the window 12*b*, the CCD sensor 7 receives an optical image of the toner particles which have been magnified by the magnifying optical system 6 and converts the optical image into an image signal, the image processing unit 9 extracts a locus of a movement of the toner particles from the image signal obtained by the CCD sensor 7, the voltage generator 8 applies a voltage V1 to the electrode 41 and applies a voltage V across the electrodes 11*a* and 11*b* in the chamber 1, and the CPU 10 controls the voltage V from the voltage generator 8 so that the toner particles pass a position in the vicinity of a focus of the magnifying optical system 6 based upon the locus of the movement of the toner particles extracted in the image processing unit 9.

In the above arrangement, a binary developer is agitated by the agitating roller 53 and carried to the electrode 41 by the magnet roller 51. In this process, the developer is charged.

When a voltage whose polarity is opposite to that of the charged developer is applied to the electrode 41, only the toner particles of the developer on the magnet roller 51 adhere to the electrode 41. When the toner particles on the electrode 41 come above the extraction opening 3, the voltage V1 whose polarity is same as that of the charged toner particles is applied to the electrode 41 from the voltage generator 8. As a result, the toner particles on the electrode 41 receive electrostatic force (repulsive force) and are removed from the electrode 41 so as to be sucked into the extraction opening 3 by the pump 2. The sucked tones particles are led to the chamber 1 for measurement.

The voltage V is applied across the electrodes 11*a* and 11*b* in the chamber 1 from the voltage generator 8. The electrode sections of the conductive coatings having high resistance on the windows 12*a* and 12*b* can be electrically connected with the electrodes 11*b* and 11*a* by a switch. In this case, since electric current flows in the conductive coating having high resistance, an uniform electric field is formed between the electrodes 11*a* and 11*b*. Furthermore, even if the toner particles adhere to the wall of the chamber 1, turbulence of the electric field can be restricted to a minimum.

The toner particles enter the chamber 1 along the Z-axis at a speed of v0 by air blow. In the chamber 1, the toner particles receive force of qE in a y-axis direction and force of mg in a z-axis direction. Here, q represents an amount of charge of toner particles, E represents the electric field in the chamber 1, m represents mass of the toner particles and g represents gravitational acceleration.

The locus of the movement of the toner particles is caught by the magnifying optical system 6 and the CCD sensor 7, and is analyzed by the image processing unit 9 and the CPU 10. Then, the voltage V is applied across the electrodes 11*a* and 11*b* from the voltage generator 8 based upon a command from the CPU 10 so that the toner particles pass a prescribed position in the vicinity of the focus of the magnifying optical system 6. An amount of charge of the toner particles can be obtained from a value of the voltage V.

In the case where the inside of the chamber 1 is cleaned, the electrode sections on the conductive coatings having high resistance in the windows 12*a* and 12*b* are electrically cut off by a switch from the electrodes 11*b* and 11*a* and an alternating voltage is applied from the voltage generator 8 so that an alternating electric field is formed between the electrodes 11*a* and 11*b*. As a result, dust such as toner particles which adheres to the windows 12*a* and 12*b* is removed from the inner wall of the chamber 1 and is eliminated by air blow.

Here, the voltage V1 for extracting the toner particles is applied across the electrode 41 and a ground, but it is preferable that the extraction opening 3 is connected with the ground and an insulating film is formed on a surface of the extraction opening 3 which is opposite to the electrode 41.

The windows 12*a* and 12*b* having conductive coatings having high resistance can be obtained by, for concrete example, depositing ($SnO_2$+Cr) whose film thickness is 0.13 μm on glass. Electric conductivity of the conductive coating is approximately 3.0 kΩ/$cm^2$.

As mentioned above, in the present invention, the voltage V is applied to between the electrodes 11*a* and 11*b* from the voltage generator 8 so that the toner particles pass the prescribed position in the vicinity of the focus of the magnifying optical system 6, and the amount of charge of toner is obtained from a value of the voltage V. With this arrangement, only the vicinity of the focus of the magnifying optical system 6 should be illuminated. For this reason, the small-sized light source 15 is sufficient. Moreover, a scan system for measurement which covers a wide region is not required. As a result, the measuring section 20 for an amount of charge of toner becomes compact and thereby easily installing it in a copying machine.

In addition, since the amount of charge of toner is measured by extracting the toner particles from the developing unit 5, the amount of charge of toner at the time of image formation can be obtained.

Figure 3:
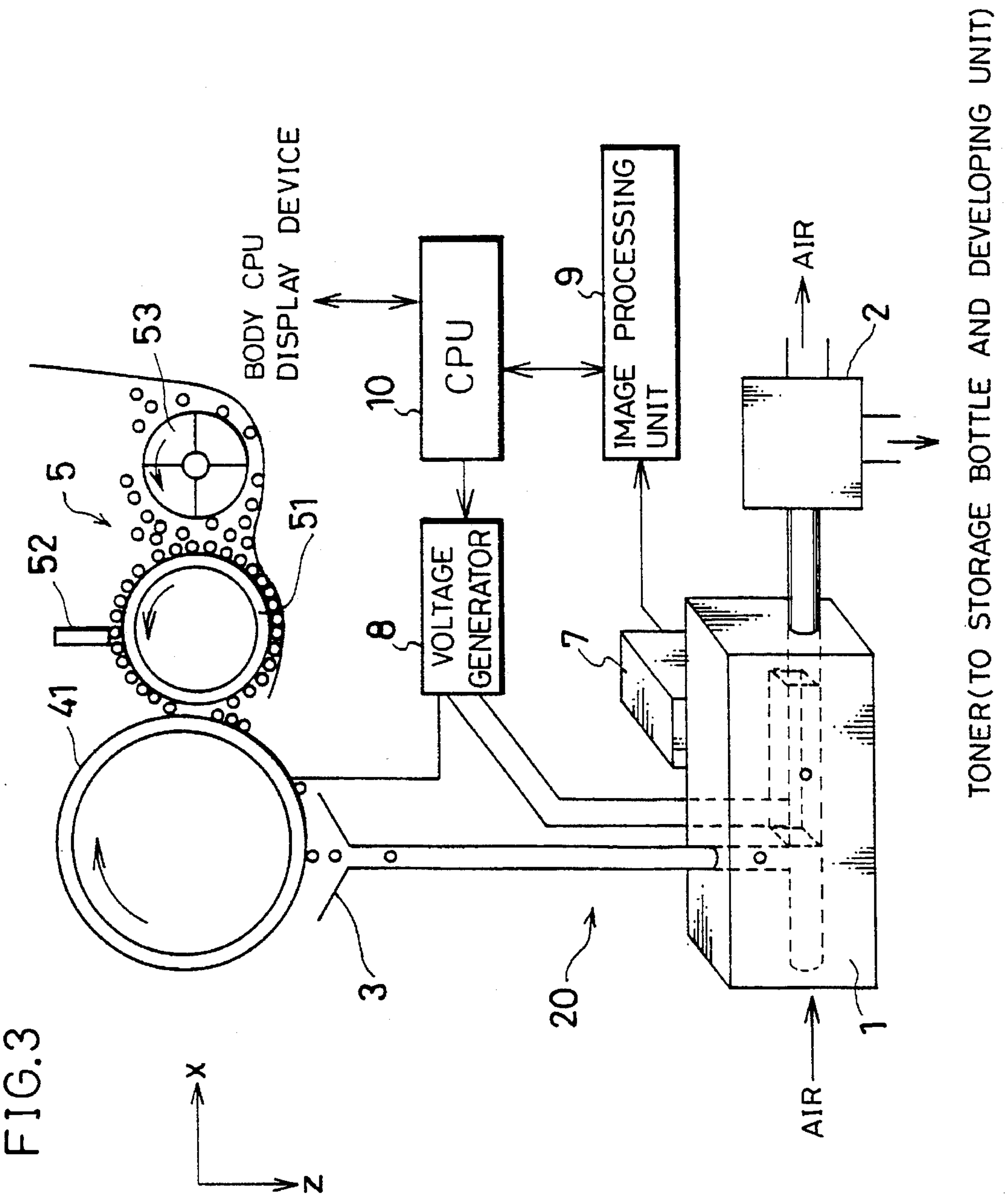
FIG. 3 is a constitutional drawing of a copying machine which schematically shows a second embodiment of the present invention.
Figure 4:
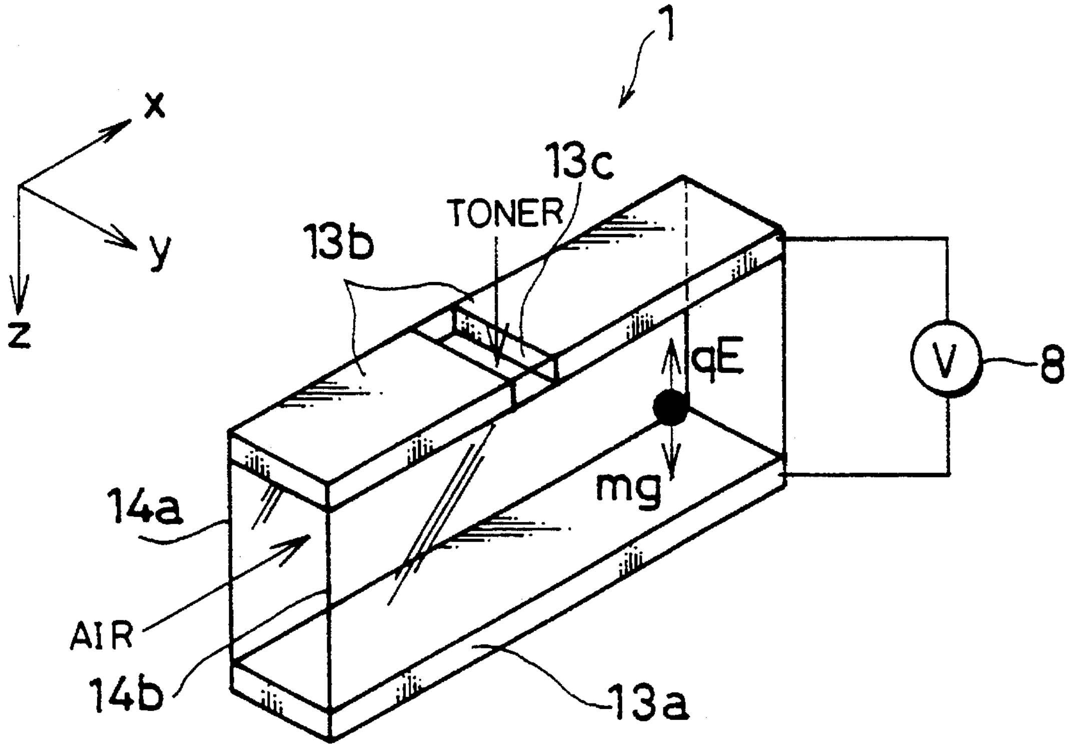
FIG. 4 is an explanatory drawing which shows a constitution of a chamber in the copying machine shown in FIG. 3.

The following description will discuss a second embodiment of the present invention referring to FIGS. 3 and 4. Here, for convenience of explanation, those members of the present embodiment that have the same arrangement and function, and that are mentioned in the aforementioned embodiment are indicated by the same reference numerals and description thereof is omitted.

As shown in FIG. 3, in a copying machine (image forming apparatus) of the present embodiment, a construction of the chamber 1 is different from that of the aforementioned embodiment.

As shown in FIG. 4, the chamber 1 is arranged so that its length is parallel to the x-axis direction. The chamber 1 includes windows 14*a* and 14*b* (first and second windows), which are vertical to the y-axis and arranged opposite to each other, and electrodes 13*a* and 13*b* (first and second electrodes), which are vertical to z-axis and are opposite to each other. A slit-like opening 13*c* is provided on the electrode 13*b* on the upper side so that the toner particles from the extraction opening 3 are led into the chamber 1.

Here, the light source 15 and the magnifying optical system 6, not shown, are provided so that they are respectively opposite to the windows 14*b* and 14*a*.

With the above arrangement, the toner particles drawn from the extraction opening 3 pass through the slit-like opening 13*c* of the electrode 13*b* so as to fall into the chamber 1. In the chamber 1, air streams at a constant speed v0 in the x-axis direction by an action of the pump 2.

First, the electrodes 13*a* and 13*b* are grounded and a fall speed of the toner particles is obtained only under an effect of the gravitation so that mass of the toner particles is obtained. Next, the voltage V is applied to between the electrodes 13*a* and 13*b* from the voltage generator 8 based upon a command from the CPU 10 so that the toner particles pass a prescribed position in the vicinity of the focus of the magnifying optical system 6. The amount of charge of toner is obtained from a value of the voltage V.

In other words, when the voltage V is applied so that the toner particles move in the x-axis direction, a formula: $mg=qE$ is satisfied. Therefore, q can be obtained. Moreover, since a configuration and size of the toner particles can be observed by the magnifying optical system 6, the amount of charge by the weight of the toner particles can be also obtained. Furthermore, distribution of the amount of charge of toner can be also obtained by successively changing the voltage V and counting the number of the toner particles which pass the prescribed position.

Here, it is preferable that the CCD sensor 7 is an area sensor which is capable of observing the vicinity of the focus of the magnifying optical system 6, but a line sensor whose length is parallel to the z-axis direction is also preferable in the case where only the amount of charge of toner is obtained.

As the light source 15, a light bulb, a fluorescent lamp, a high intensity LED (light emitting diode), a laser, etc. are used, but the light source 15 is not limited to them, so anything capable of obtaining an enough light amount for detection by the CCD sensor 7 may be used.

If an area sensor is used as the CCD sensor 7 and a semiconductor laser is used as the light source 15 so that the semiconductor laser is allowed to irradiate in a prescribed cycle, the fall speed of the toner particles and the amount of charge of toner can be measured at the same time.

In the above embodiment, in order to extract the toner particles, the drum-like electrode 41 was used, but instead of it, a photosensitive drum may be used. In the case of using the photosensitive drum, a prescribed electric potential is applied to a portion of a photosensitive layer and the toner particles are allowed to adhere thereto by a charging process and exposing process. Next, electric charges are removed from the portion where the toner particles adhere by exposing the portion, and the adhered toner particles should be removed.

A developer is not limited to a binary developer, so an unary developer excluding carrier particles composed of a magnetic substance may be used.

In addition, the above embodiments discussed the measurement of the amount of charge of toner illustrating a copying machine as an image forming apparatus, but the present invention is also applicable to the measurement of an amount of charge of toner in an image forming apparatus such as a laser printer.

As mentioned above, the first measuring device for an amount of charge of toner according to the present invention is arranged so as to have the countered electrodes 11*a* and 11*b* (or the electrodes 13*a* and 13*b*), the voltage generator 8, the magnifying optical system 6, the light source 15, the CCD sensor 7 and the CPU 10. The electrodes 11*a* and 11*b* (or the electrodes 13*a* and 13*b*) forms an electric field for accelerating toner particles, the voltage generator 8 applying the voltage V across the electrodes 11*a* and 11*b* (or the electrodes 13*a* and 13*b*), the magnifying optical system 6 magnifies toner particles which move between the electrodes 11*a* and 11*b* (or the electrodes 13*a* and 13*b*), the light source 15 illuminates the vicinity of the focus of the magnifying optical system 6, the CCD sensor 7 receives an optical image of toner particles magnified by the magnifying optical system 6 and converts the optical image into an image signal, and the CPU 10 controls the voltage V from the voltage generator 8 based upon an image signal so that the toner particles pass a prescribed position in the vicinity of the focus of the magnifying optical system 6 and obtains the amount of charge of toner particles from a value of the voltage V.

The above arrangement makes it possible to obtain the amount of charge of toner particles by illuminating only the vicinity of the focus of the magnifying optical system 6. For this reason, the small-sized light source 15 is suitable. Moreover, a scan system for observing a wide region is not required. As a result, the measuring device for an amount of charge of toner becomes compact, thereby easily installing in an image forming apparatus such as a copying machine.

As mentioned above, the second measuring device for an amount of charge of toner according to the present invention has an arrangement such that the window 12*a* (or the window 14*a*) for preventing the toner particles from adhering to the light source 15 and the window 12*b* (or the window 14*b*) for preventing the toner particles from adhering to the magnifying optical system 6 are provided in the first measuring device. The windows 12*a* and 12*b* (or the windows 14*a* and 14*b*) are composed of a translucent substrate and the conductive coating having high resistance which has been formed on the toner particle side of the translucent substrate. The electrode 11*a* (or the electrode 13*a*) is connected with the electrode 11*b* (or the electrode 13*b*) through the conductive coating in the window 12*a* (or the window 14*a*) and through the conductive coating in the window 12*b* (or the window 14*b*).

As a result, since the windows 12*a* and 12*b* (or the windows 14*a* and 14*b*) are provided, the light source 15 and the magnifying optical system 6 is hardly soiled by toner particles. Moreover, since an electric current flows to the conductive coatings having high resistance in the windows 12*a* and 12*b* (or the windows 14*a* and 14*b*), an uniform electric field is formed between the electrodes 11*a* and 11*b* (or the electrodes 13*a* and 13*b*). Further, even if toner particles adhere to the windows 12*a* and 12*b* (or the windows 14*a* and 14*b*), turbulence of the electric field can be restricted to a minimum. This makes it possible to accurately measure an amount of charge of toner.

As mentioned above, the third measuring device for an amount of charge of toner according to the present invention has an arrangement such that the window 12*a* (or the window 14*a*) for preventing toner particles from adhering to the light source 15 and the window 12*b* (or the window 14*b*) for preventing toner particles from adhering to the magnifying optical system 6 are provided in the first measuring device for an amount of charge of toner. The windows 12*a* and 12*b* (or the windows 14*a* and 14*b*) are composed of a translucent substrate and a conductive coating having high resistance which has been formed on the toner particle side of the translucent substrate. The electrode 11*a* (or the electrode 13*a*) is connected with the conductive coating in the window 12*a* (or the window 14*a*), and the electrode 11*b* (or the electrode 13*b*) is connected to the conductive coating in the window 12*b* (or the window 14*b*).

The above arrangement makes it possible not only to clean dirt due to toner particles on the electrodes 11*a* and 11*b* (or the electrodes 13*a* and 13*b*) but also to clean dirt on the windows 12*a* and 12*b* (or the windows 14*a* and 14*b*) by applying an alternating voltage across the electrodes 11*a* and 11*b* (or the electrodes 13*a* and 13*b*). This makes it possible to accurately measure an amount of charge of toner.

As mentioned above, the fourth measuring device for an amount of charge of toner according to the present invention has an arrangement such that the light source 15 is a semiconductor laser which illuminates in a prescribed cycle in the first, second or third measuring device for an amount of charge of toner.

The above arrangement makes it possible to measure speed of toner particles and an amount of charge of toner simultaneously. Therefore, the measurement can be made rapidly.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A measuring device for an amount of charge of toner, comprising:

countered first and second electrodes for forming an electric field which accelerates toner particles;

a voltage generator for applying a voltage across said first and second electrodes;

a magnifying optical system for magnifying an image of the toner particles which move between said first and second electrodes;

a light source for illuminating a vicinity of a focus of said magnifying optical system a CCD sensor for receiving an optical image of the toner particles magnified by said magnifying optical system so as to convert the optical image into an image signal; and control means for controlling a voltage from said voltage generator based upon the image signal so that the toner particles pass a prescribed position in the vicinity of the focus of said magnifying optical system and for obtaining an amount of charge of toner particles from a value of the voltage.

2. The measuring device for an amount of charge of toner as defined in claim 1 is provided with a first window and a second window, said first window preventing the toner particles from adhering to said light source, said second window preventing the toner particles from adhering to said magnifying optical system.

3. The measuring device for an amount of charge of toner as defined in claim 2, wherein said first and second windows are composed of a translucent substrate and a conductive coating which has been formed on opposite inner surfaces where the toner particles pass.

4. The measuring device for an amount of charge of toner as defined in claim 3, wherein said first electrode is connected to said second electrode through the conductive coating in said first window and through the conductive coating in said second window.

5. The measuring device for an amount of charge of toner as defined in claim 3, wherein said first electrode is connected with the conductive coating in said first window and said second electrode is connected with the conductive coating in said second window.

6. The measuring device for an amount of charge of toner as defined in claim 5, further comprising:

a first switch means for connecting said first electrode with the conductive coating in said second window;

a second switch means for connecting said second electrode with the conductive coating in said first window; and a voltage applying means for applying an alternating voltage to between said first and second electrodes.

7. The measuring device for an amount of charge of toner as defined in claim 3, wherein the translucent substrate in said first and second windows is composed of glass and the conductive coating is composed of $SnO_2$ and Cr.

8. The measuring device for an amount of charge of toner as defined in claim 3, wherein electric conductivity of the conductive coating is 1 $k\Omega/cm^2$ order.

9. The measuring device for an amount of charge of toner as defined in claim 1, further comprising means for grounding said first and second electrodes in order to obtain mass of the toner particles from fall speed of the toner particles.

10. The measuring device for an amount of charge of toner as defined in claim 1, wherein the surfaces of said first and second electrodes are set so as to be level with each other so that said first and second electrodes can accelerate the toner particles in an opposite direction to gravitation.

11. The measuring device for an amount of charge of toner as defined in claim 10, wherein said control means controls a voltage generated from the voltage generator so that gravitation which is applied to the toner particles is eliminated.

12. The measuring device for an amount of charge of toner as defined in claim 1, wherein said CCD sensor is an area sensor.

13. The measuring device for an amount of charge of toner as defined in claim 12, wherein said light source is a semiconductor laser for emitting a light in a prescribed cycle.

14. An image forming apparatus, comprising:

a photosensitive drum;

a developing unit for allowing charged toner to adhere to said photosensitive drum according to image information; and a measuring device for measuring an amount of charge of toner which has been charged in said developing unit, wherein said measuring device for an amount of charge of toner includes:

countered first and second electrodes for forming an electric field which accelerates toner particles;

a voltage generator for applying a voltage across said first and second electrodes;

a magnifying optical system for magnifying the image of toner particles which move between said first and second electrodes;

a light source for illuminating a vicinity of a focus of said magnifying optical system;

a CCD sensor for receiving an optical image of the toner particles magnified by said magnifying optical system so as to convert the optical image into an image signal; and control means for controlling a voltage from said voltage generator based upon the image signal so that the toner particles pass prescribed position in the vicinity of the focus of said magnifying optical system and for obtaining an amount of charge of toner particles from a value of the voltage.

15. The image forming apparatus as defined in claim 14, further comprising:

an extraction electrode for extracting toner charged in said developing unit; and a pump for carrying the toner extracted by said extraction electrode to between said first and second electrodes.

16. The image forming apparatus as defined in claim 15, wherein said extraction electrode is a part of said photosensitive drum.

* * * * *